United States Patent
Ghneim et al.

(10) Patent No.: US 7,232,744 B2
(45) Date of Patent: Jun. 19, 2007

(54) METHOD FOR IMPLANTING DOPANTS WITHIN A SUBSTRATE BY TILTING THE SUBSTRATE RELATIVE TO THE IMPLANT SOURCE

(75) Inventors: Said Ghneim, Richardson, TX (US); James D. Bernstein, Plano, TX (US); Lance S. Robertson, Rockwall, TX (US); Jiejie Xu, Plano, TX (US); Jeffrey Loewecke, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/956,583

(22) Filed: Oct. 1, 2004

(65) Prior Publication Data

US 2006/0073685 A1 Apr. 6, 2006

(51) Int. Cl.
*H01L 21/265* (2006.01)
(52) U.S. Cl. ................. 438/519; 438/527; 438/914; 257/E21.633
(58) Field of Classification Search ................ 438/519, 438/527, 914, FOR. 161; 250/443.1; 257/E21.633
See application file for complete search history.

(56) References Cited

U.S. PATENT DOCUMENTS

| 4,661,712 | A |   | 4/1987  | Mobley             |
|-----------|---|---|---------|--------------------|
| 5,753,923 | A |   | 5/1998  | Mera et al.        |
| 6,060,375 | A | * | 5/2000  | Owyang et al. ............. 438/585 |
| 6,437,350 | B1| * | 8/2002  | Olson et al. ........... 250/492.21 |
| 6,472,715 | B1| * | 10/2002 | Liu et al. .................... 257/371 |
| 6,573,518 | B1| * | 6/2003  | Renau et al. .......... 250/492.21 |
| 6,583,010 | B2| * | 6/2003  | Mo ............................ 438/270 |
| 2003/0122088 | A1| * | 7/2003 | Sheng et al. ........... 250/492.21 |
| 2003/0224541 | A1| * | 12/2003 | Huang et al. .................. 438/14 |
| 2004/0043586 | A1| * | 3/2004 | Ahmed et al. .............. 438/514 |

FOREIGN PATENT DOCUMENTS

JP             63184365 A  *  7/1988

OTHER PUBLICATIONS

Christopher Campbell, et al.; "Beam Angle Control on the VIISta 80 Ion Implanter".

* cited by examiner

*Primary Examiner*—Michelle Estrada
(74) *Attorney, Agent, or Firm*—Peter K. McLarty; W. James Brady, III; Frederick J. Telecky, Jr.

(57) ABSTRACT

The present invention provides a method for implanting a dopant in a substrate and a method for manufacturing a semiconductor device. The method for implanting a dopant, among other steps, including tilting a substrate (310) located on or over an implant platen (305) about an axis in a first direction with respect to an implant source (320) and implanting a portion of an implant dose within the substrate (310) tilted in the first direction. The method further includes tilting the substrate (310) having already been tilted in the first direction about the axis in a second opposite direction, and implanting at least a portion of the implant dose within the substrate (310) tilted in the second opposite direction.

20 Claims, 7 Drawing Sheets

METHOD FOR IMPLANTING DOPANTS WITHIN A SUBSTRATE BY TILTING THE SUBSTRATE RELATIVE TO THE IMPLANT SOURCE

TECHNICAL FIELD OF THE INVENTION

The present invention is directed, in general, to a method for implanting dopants and, more specifically, to a method for implanting dopants by tilting a substrate and a method of manufacturing a semiconductor device use the same.

BACKGROUND OF THE INVENTION

Advanced integrated circuit design requires precise control of beam incidence angle. While a number of different types of beam incidence angle error exist, three of the more common types are cone angle error, beam steering error and parallelism error across the wafer. Cone angle error is typically a result of cone angle effects caused by the geometry of the wafer scanning system. Cone angle error causes within wafer variation. For example the beam angle error may be about −x degrees at one edge of the wafer, be approximately zero degrees as the center of the wafer, and be about +x degrees at the opposing edge of the wafer.

Steering error, on the other hand, tends to be a fixed error across the wafer that is introduced while tuning the beam between lots, implant batches, or whenever the tuning may occur. The parallelism error, for whatever reason, leads to random beam incidence angle errors across the width of the wafer. This error is particularly difficult to correct as a result of its random nature.

Unfortunately, without precise control of beam incidence angle, various different problems degrade the transistors of the integrated circuit. As an example, transistor asymmetry, variation, and depressed MPY often result due to beam incidence angle error. The beam angle incidence angle error also typically leads to gate shadowing and an asymmetric dopant distribution, both of which are undesirable.

Figure 1:
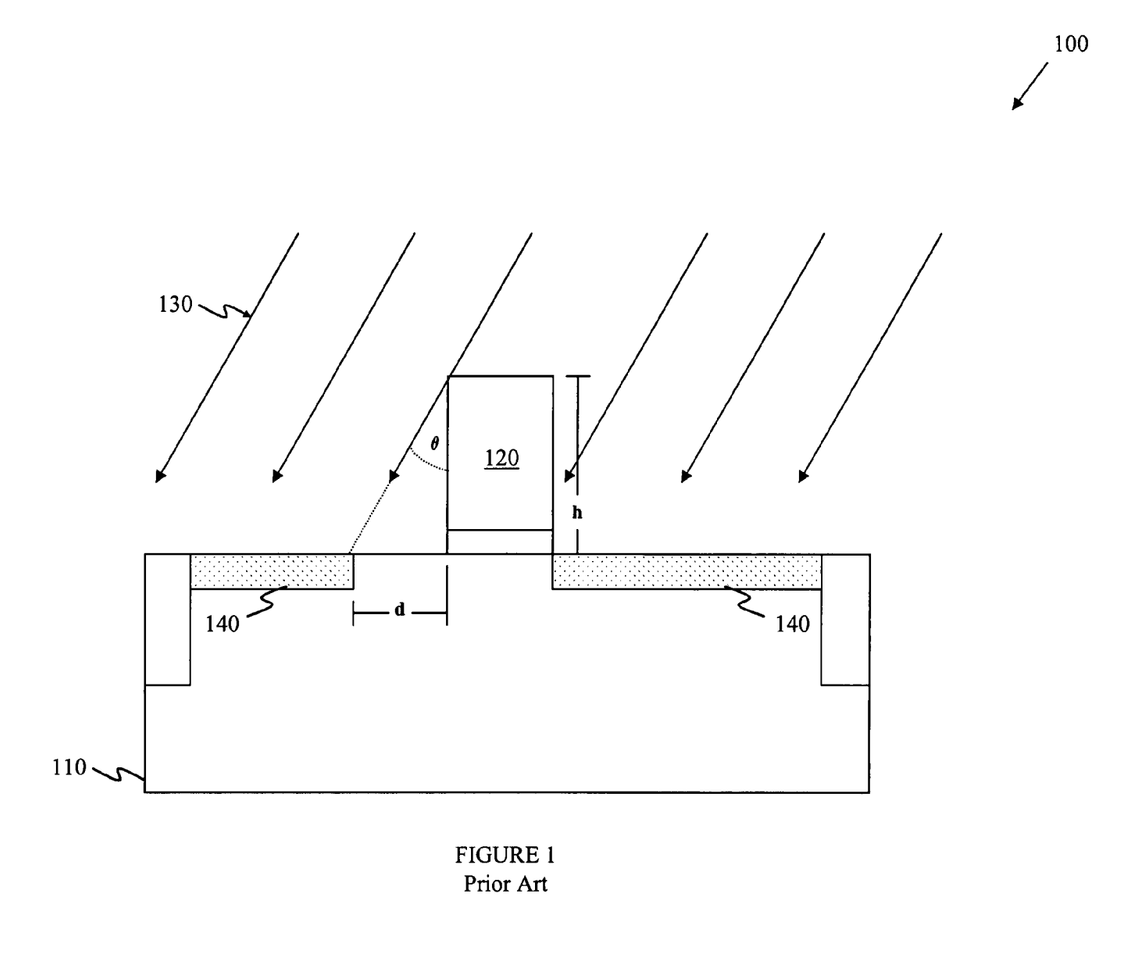
FIG. 1 illustrates an example of gate shadowing on a transistor device.

Turning to FIG. 1, illustrated is an example of gate shadowing on a transistor device 100. The transistor device 100 illustrated in FIG. 1 includes a gate structure 120, having a height (h), located over a substrate 110. The transistor device 100 illustrated in FIG. 1 is being subjected to an implant process 130 to form implant regions 140. As is illustrated, the combination of the implant beam incidence angle (θ) and gate structure 120 height (h) causes the implant regions 140 located within the substrate 110 not be placed equidistance from the gate structure 120. For example, one of the implant regions 140 is located a distance (d) from the sidewall of the gate structure 120, where the other implant region 140 is located adjacent the sidewall of the gate structure 120. While the distance (d) can be estimated using the equation d=h tan(θ), it nevertheless creates an undoped region defined by the distance (d) that often tends to cause serious operational problems for the transistor 100.

Accordingly, what is needed in the art is a method for implanting dopants within a substrate that does not experience the drawbacks of the prior art methods and devices.

SUMMARY OF THE INVENTION

To address the above-discussed deficiencies of the prior art, the present invention provides a method for implanting a dopant in a substrate and a method for manufacturing a semiconductor device. The method for implanting a dopant, among other steps, including tilting a substrate located on or over an implant platen about an axis in a first direction with respect to an implant source and implanting a portion of an implant dose within the substrate tilted in the first direction. The method further includes tilting the substrate having already been tilted in the first direction about the axis in a second opposite direction, and implanting at least a portion of the implant dose within the substrate tilted in the second opposite direction.

As previously indicated, the present invention further includes a method for manufacturing a semiconductor device. Without limitation, the method for manufacturing the semiconductor device includes (1) forming a gate structure over a substrate, and (2) forming implants within the substrate proximate the gate structure, as indicated above.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

Figure 2:
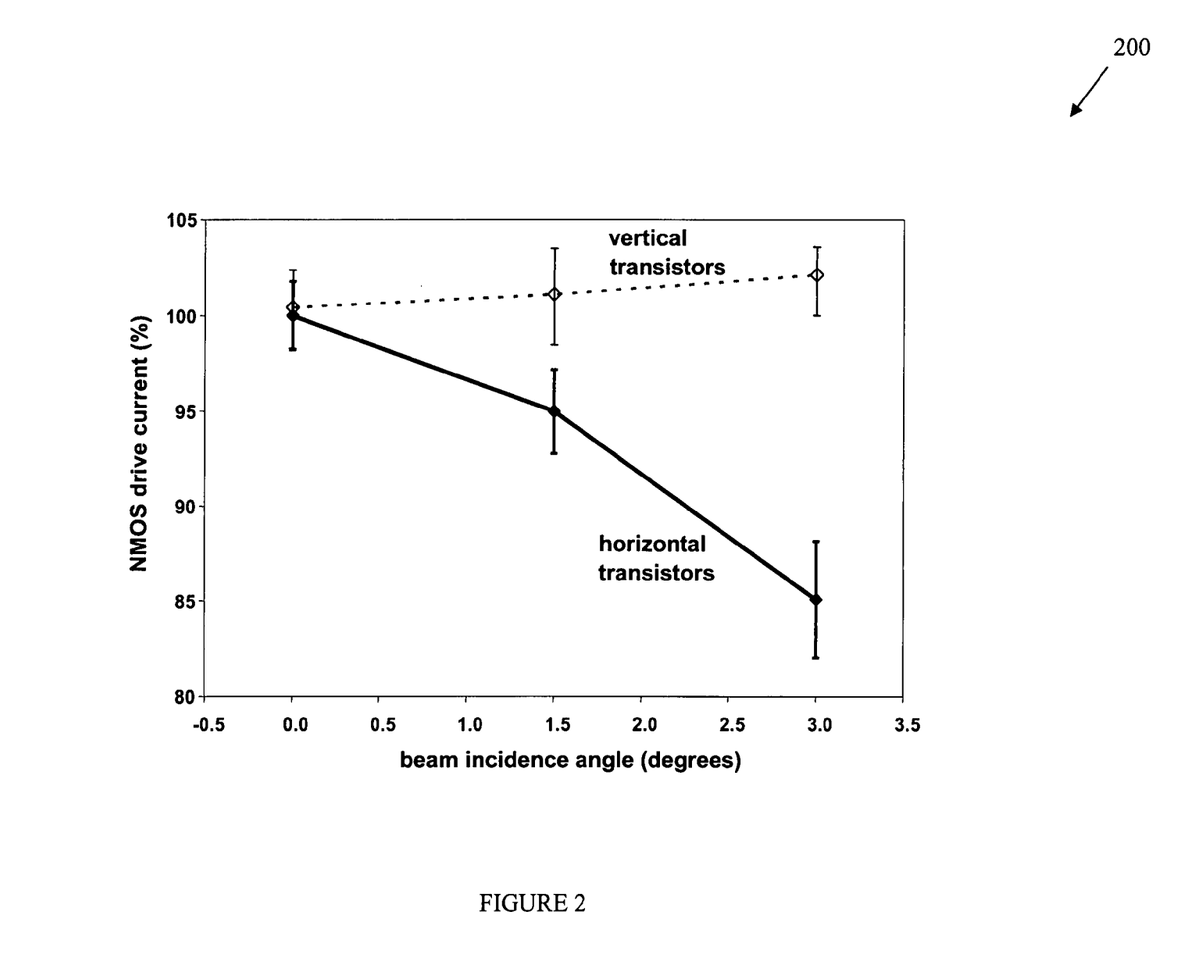
FIG. 2 illustrates a graph illustrating the impact that beam incidence angle error has on the drive current of an n-channel metal oxide semiconductor (NMOS) device for both vertical transistors and horizontal transistors on the same wafer.

The present invention is based in part on the recognition that beam incidence angle error often has a different affect on vertical transistors located on a semiconductor wafer than similar horizontal transistors located on the same semiconductor wafer. Turning briefly to FIG. 2, shown is a graph 200 illustrating the impact that beam incidence angle error has on the drive current of an n-channel metal oxide semiconductor (NMOS) device for both vertical transistors and horizontal transistors on the same wafer. As the beam incidence angle error increases from about −0.5 degrees to about 3.0 degrees the respective drive currents of the vertical transistors and horizontal transistors are affected differently. Specifically, in the example of FIG. 2, the horizontal transistors are substantially affected by the beam incidence angle error whereas the vertical transistors are not. The opposite effect would obviously hold true if the beam incidence angle error were in a direction normal to what it is in the example of FIG. 2. Unfortunately, the disparate change in drive current between the vertical transistors and horizontal transistors makes accommodating the change in drive current extremely difficult.

In combining the aforementioned recognition with the appreciation that beam incidence angle error tends to vary across the wafer the present invention recognized that superior implant benefits could be achieved by tilting an implantable substrate located on or over an implant platen about an axis in a first direction with respect to an implant source, implanting a portion of an implant dose within the substrate tilted in the first direction, then tilting the substrate having already been tilted in the first direction about the axis in a second opposite direction, and implanting at least a portion of the implant dose within the substrate tilted in the second opposite direction. The present invention further recognized that superior benefits could be achieved if the implantable substrate were to be rotated by about 90 degrees from its original position, and the multiple tilt/implant process were to occur again. In an exemplary situation, ¼ of the total implant dose would be implanted at each of the four substrate positions.

The aforementioned implant process reduces the transistor asymmetry by reducing the implant shadowing due to the beam incidence angle error. In most instances, it improves the transistor asymmetry for both NMOS and PMOS transistors. Additionally, it attempts to make both the vertical and horizontal transistors have substantially similar dopant profiles, and thus drive currents. These benefits lead to, among others, improved transistor matching circuitry and improved SRAM balance.

Figure 3:
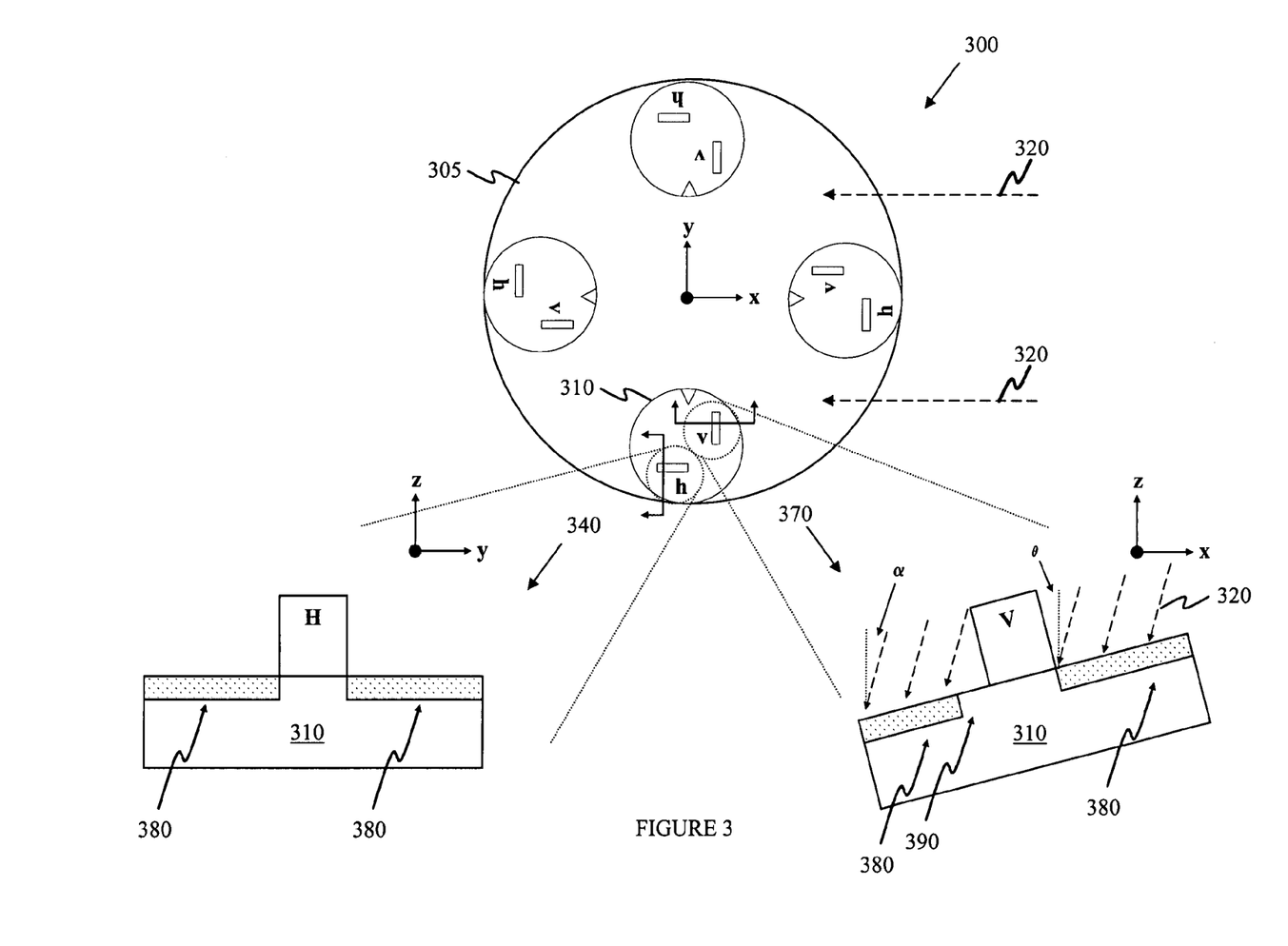
FIG. 3 illustrates a plan view, and two cross-sectional views of a plurality of substrates located on or over an implant platen as they are being subjected to an implant source.

Turning now to FIGS. 3–6, illustrated are plan and cross-sectional views of detailed manufacturing steps illustrating how one might in an exemplary embodiment implant a dopant within a substrate in accordance with the principles of the present invention. Turning initially to FIG. 3, illustrated are a plan view 300, and two cross-sectional views 340, 370 of a plurality of substrates 310 located on or over an implant platen 305 as they are being subjected to an implant source 320. For clarification, the plan view 300 and two cross-sectional views 340, 370, are a snapshot of the implant platen 305 and substrates 310 as they rotate about a center point of the implant platen 305. As those skilled in the art are aware, the implant platen 305 in the embodiment of FIG. 3 typically rotates in a clockwise or counter-clockwise direction at a high rate of speed as the implant source 320 slowly scans across the implant platen 305 from side to side.

The embodiment of FIG. 3 illustrates that only four substrates 310 are located on or over the implant platen 305. In actuality, any number of substrates 310, for example from one substrate 310 to an infinite number of substrates 310, could be located on or over the implant platen 305. Additionally, while the implant platen 305 is illustrated in FIG. 3 as a disk, those having skill in the art appreciate that the shape of the implant platen 305, design of the implant platen 305, and for that matter the design of the implanter itself, may vary widely while staying within the scope of the present invention.

Each of the substrates 310 in the embodiment of FIG. 3 have both vertical (v) and horizontal (h) transistors. This is often the case in today's integrated circuits, especially in view of the apparent need to save wafer real-estate. Nevertheless, the inventive aspects of the present invention are applicable to those situations where only vertical (v) or horizontal (h) transistors exist.

As indicated above, it is often the case where the implant source 320 has an implant angle error associated therewith. This implant angle error is illustrated in FIG. 3 as (α). The implant angle error (α) is difficult to discern in the top view 300, however, it can easily be discerned by looking to the cross-sectional view 370 of FIG. 3. In line with this, the implant angle error (α) is difficult to discern in the cross-sectional view 340, as it is running into and out of the page. The implant angle error (α) should generally be as low as possible, however, any conceivable implant angle error (α) could be dealt within using the unique aspects of the present invention. It is often the case where in the implant angle error (α) ranges up to about 5 degrees.

The inventive method of the present invention is configured to reduce the effect of the implant angle error (α) by partially implanting the substrates 310 a number of different times in a number of different configurations until a given implant dose is attained. With that in mind, the substrates 310 are tilted about an axis in a first direction with respect to the implant source 320. In the embodiment illustrated in FIG. 3, the substrates 310 are tilted about the y-axis counterclockwise by an angle (θ). After the substrates 310 are tilted, ¼ of the implant dose is implanted into the substrates 310.

The tilt angle (θ) of the substrate 310 may vary greatly. In an exemplary embodiment of the invention the tilt angle (θ) is substantially equal to the implant angle error (α) of the implant source 320. In this embodiment, the tilt angle (θ) would, but for a small region of less doped substrate common to both the vertical (v) and horizontal (h) transistors, substantially eliminate the effect of the implant angle error (α). Nevertheless, an exemplary embodiment suggests that the tilt angle (θ) be up to about 5 degrees, and particularly between about 1 degree and about 3 degrees. Other tilt angles (θ) are within the scope of the present invention.

Additionally, the tilt angle (θ) may be achieved using a number of different processes. For example, one embodiment of the invention has the entire implant platen 305 tilt to effectuate the tilt of the substrates 310. Another different embodiment of the invention has each of the individual substrates 310 tilting on the implant platen 305 while a tilt angle of the implant platen 305 remains unchanged. Those skilled in the art could easily conceive of other possibilities for tilting the substrates 310.

As shown by the cross-sectional view 340, the implant angle error (α) does not substantially affect the horizontal transistor (h). For example, implant regions 380 formed as a result of the first portion of the implant dose are located equidistance from the gate of the horizontal transistor (h).

On the other hand, as shown by the cross-sectional view 370, the implant angle error (α) does substantially affect the vertical transistor (v). The gate shadowing caused by the combination of the implant angle error (α) and tilt angle (θ) causes the implant regions 380 of the vertical transistor (v) to not be located equidistance from the gate of the vertical transistor (v). For instance, as illustrated in FIG. 3, one implant region 380 is removed from the gate structure of the vertical transistor (v) and the other implant region 380 is located adjacent the gate structure of the vertical transistor (v). What results is a lighter doped region 390 located proximate the gate structure of the vertical transistor (v), the lighter doped region 390 having little to no dopant therein. At the stage shown in FIG. 3, the lighter doped region 390 has substantially no dopant therein. The implant regions 380 located in the substrate 310 at this stage contain only ¼ of the total desired implant dose.

Figure 4:
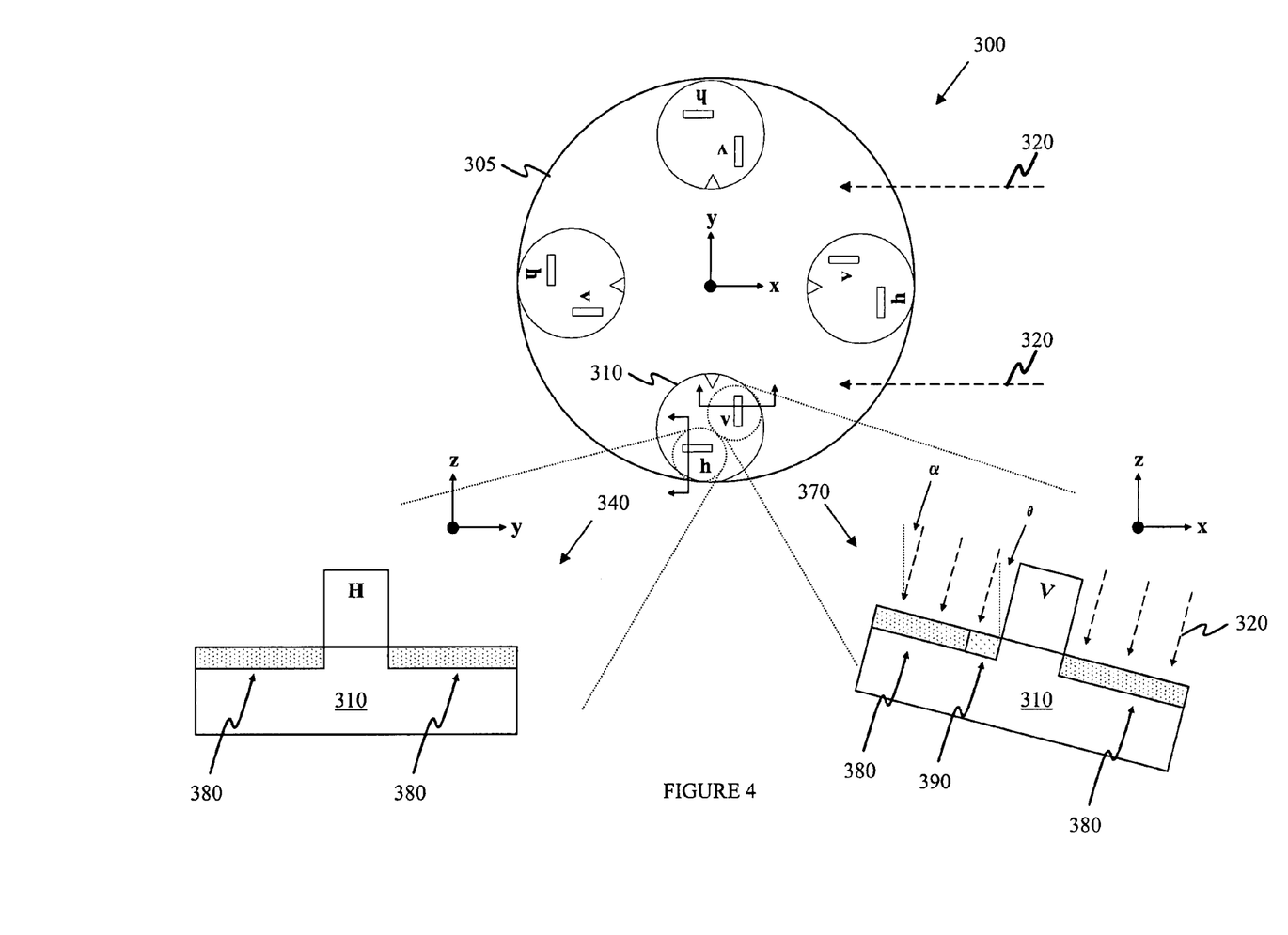
FIG. 4 illustrates the views shown in FIG. 3 after the substrates have been tilted about the same axis but in the opposite direction.

Turning now to FIG. 4, illustrated are the views 300, 340, 370 illustrated in FIG. 3 after the substrates 310 have been tilted about the same axis but in the opposite direction. In the embodiment illustrated in FIG. 4, the substrates 310 are tilted about the y-axis clockwise by the angle (θ). In an exemplary embodiment, the tilt angle (θ) used in FIG. 4 is substantially identical in value, but opposite in direction, to the tilt angle (θ) used in FIG. 3. After the substrates 310 are tilted this second time, another ¼ of the implant dose is implanted into the substrates 310.

As shown by the cross-sectional view 340, the implant angle error (α) again does not substantially affect the horizontal transistor (h). For example, implant regions 380 formed as a result of the second portion of the implant dose are still located equidistance from the gate of the horizontal transistor (h). This time, however, as shown by the cross-sectional view 370, the implant angle error (α) does not substantially affect the vertical transistor (v), as the implant angle error (α) is substantially offset by the tilt angle (θ). What results is a full ¼ implant dose reaching the implant regions 380 of the substrate 310, as well as a full ¼ implant dose reaching the lighter doped region 390. Accordingly, the implant regions 380 of both the vertical transistor (v) and the horizontal transistor (h) at this stage cumulatively have a ½ implant dose and the lighter doped region 390 located proximate the gate of the vertical transistor (v) has a ¼ implant dose.

Figure 5:
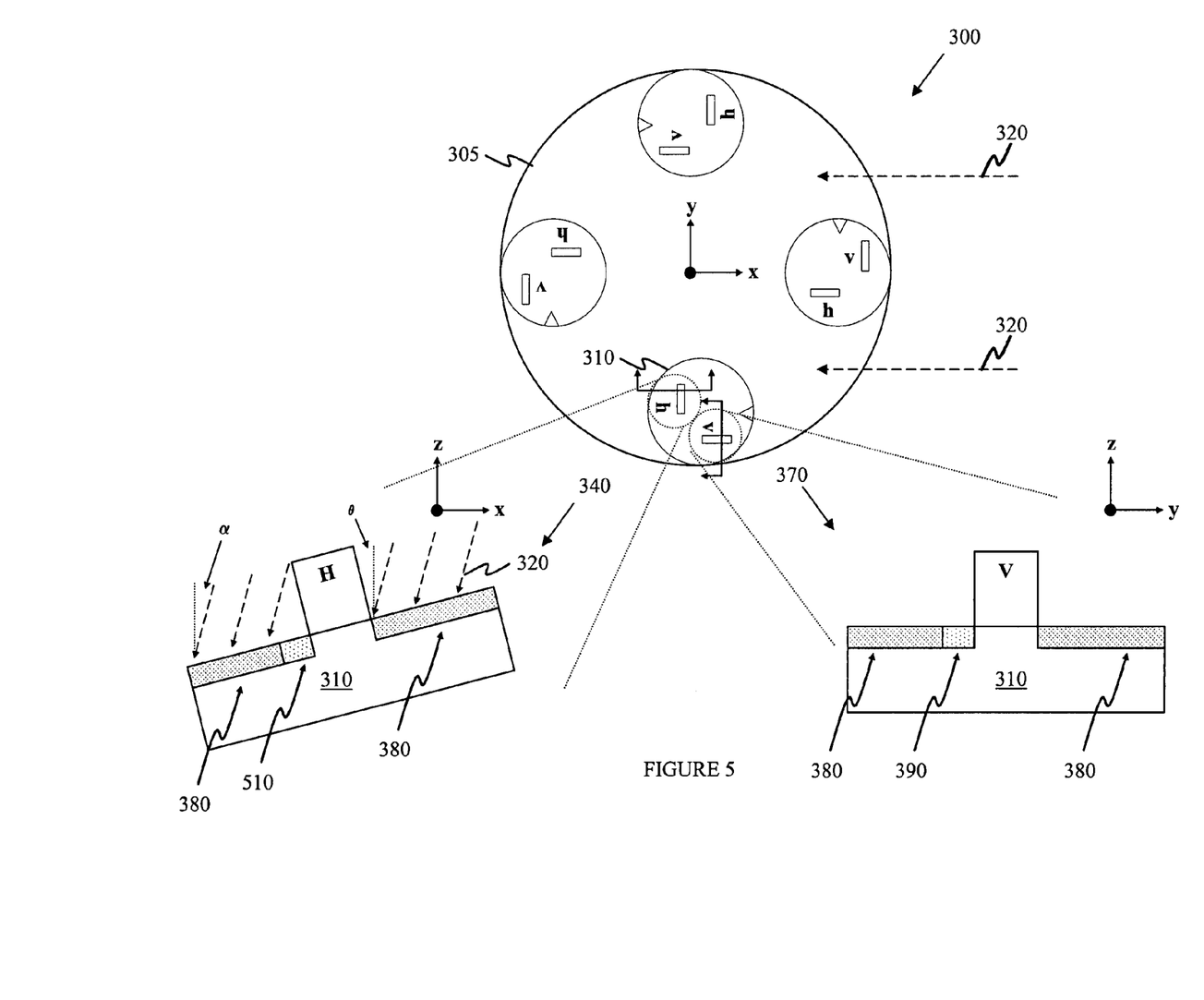
FIG. 5 illustrates the views shown in FIG. 4 after the substrates have been rotated by a specific angle and then tilted about the same axis as they were tilted in FIGS. 3–4.

Turning now to FIG. 5, illustrated are the views 300, 340, 370 illustrated in FIG. 4 after the substrates 310 have been rotated by a specific angle and then tilted about the same axis as they were tilted in FIGS. 3–4. In the embodiment illustrated in FIG. 4, the substrates 310 are rotated about the z-axis by about 90 degrees in a clockwise direction and are tilted about the y-axis counterclockwise by the angle (θ). It should be noted that to get the best results the substrates 310 should be rotated by about 90 degrees in either the clockwise or counterclockwise direction from the position they were located in FIGS. 3–4. After the substrates 310 are rotated and tilted this third time, another ¼ of the implant dose is implanted into the substrates 310.

As shown by the cross-sectional view 340, the implant angle error (α) now does substantially affect the horizontal transistor (h). The gate shadowing caused by the combination of the implant angle error (α) and tilt angle (θ) causes the implant regions 380 of the horizontal transistor (h) to not be located equidistance from the gate of the horizontal transistor (h). For instance, as illustrated in FIG. 5, one implant region 380 is removed from the gate structure of the horizontal transistor (h) and the other implant region 380 is adjacent the gate structure of the horizontal transistor (h). What results is a lighter doped region 510 located proximate the gate structure of the horizontal transistor (h) having only a ½ dose whereas the implant regions 380 of the horizontal transistor (h) have cumulatively a ¾ dose. On the other hand, the vertical transistors (v) are not substantially affected by the implant angle error (α) in this configuration. Accordingly, the implant regions 380 of the vertical transistors (v) now cumulatively have a ¾ implant dose and the lighter doped region 390 cumulatively has a ½ implant dose.

Figure 6:
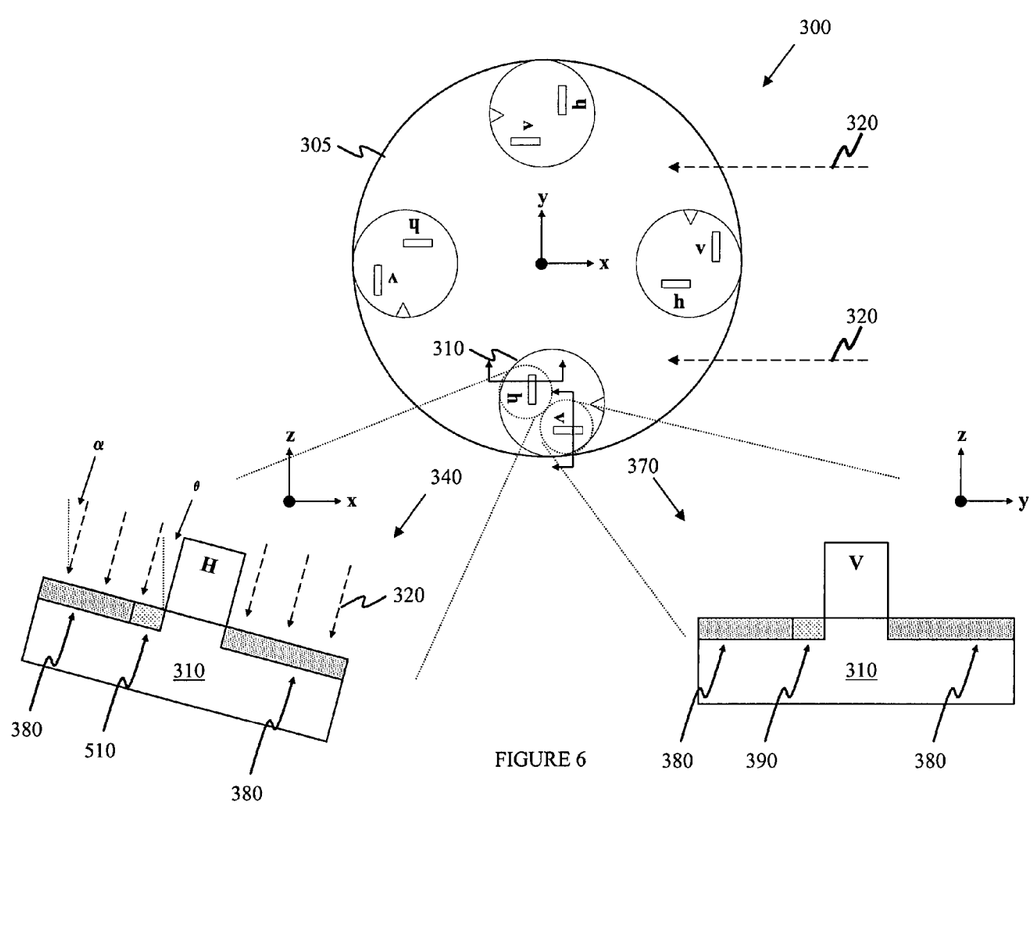
FIG. 6 illustrates the views shown in FIG. 5 after the substrates have been tilted about the same axis but in the opposite direction.

Turning now to FIG. 6, illustrated are the views 300, 340, 370 illustrated in FIG. 5 after the substrates 310 have been tilted about the same axis but in the opposite direction. In the embodiment illustrated in FIG. 6, the substrates 310 are tilted about the y-axis clockwise by the angle (θ). After the substrates 310 are tilted this fourth time, another ¼ of the implant dose is implanted into the substrates 310.

As shown by the cross-sectional view 340, the implant angle error (α) this time does not substantially affect the horizontal transistor (h), as the implant angle error (α) is substantially offset by the tilt angle (θ). What results is a full ¼ implant dose reaching the implant regions 380 of the substrate 310, as well as a full ¼ implant dose reaching the lighter doped region 510. Additionally, as shown by the cross-sectional view 370, the implant angle error (α) again does not substantially affect the vertical transistor (v). What results is a full ¼ implant dose reaching the implant regions 380 of the vertical transistor (v) as well as a full ¼ implant dose reaching the lighter doped region 390. Accordingly, the implant regions 380 of both the vertical transistor (v) and the horizontal transistor (h) at this stage have cumulatively a full implant dose and the lighter doped region 390 located proximate the gate of the vertical transistor (v) and the lighter doped region 510 located proximate the gate of the horizontal transistor (h) each have cumulatively a ¾ implant dose.

Ideally, as illustrated in FIG. 6, the resulting vertical transistors (v) and horizontal transistors (h) have substantially identical dopant profiles. Accordingly, the resulting vertical transistors (v) and horizontal transistors (h) have substantially identical drive currents. Not only do the resulting vertical transistors (v) and horizontal transistors (h) have substantially identical drive currents, the lighter doped regions 390, 510, each have at least ¾ of the desired dose. Further, the inventive aspects of the present invention are particularly useful for forming lightly doped source/drain extension implants.

Figure 7:
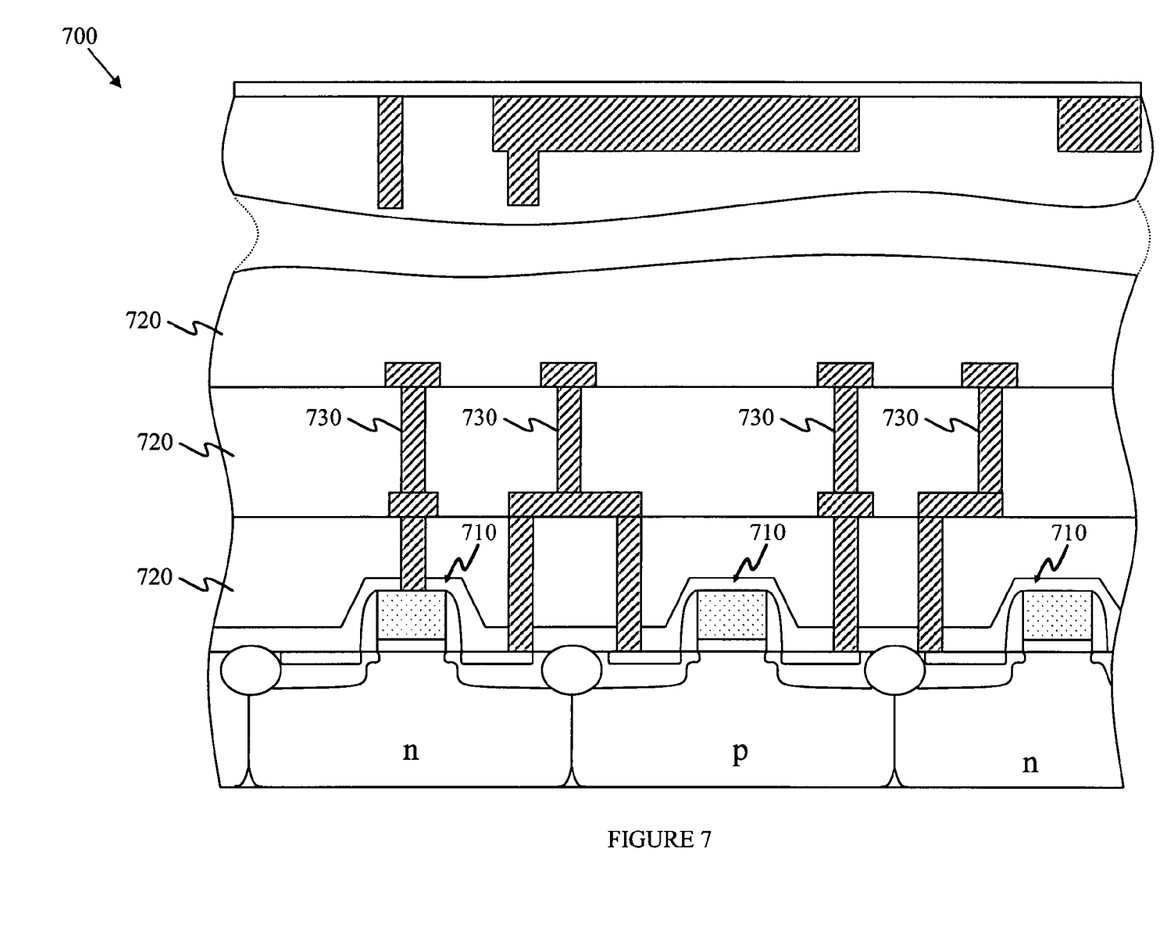
FIG. 7 illustrates a cross-sectional view of a conventional integrated circuit (IC) incorporating semiconductor devices constructed according to the principles of the present invention.

Referring finally to FIG. 7, illustrated is a cross-sectional view of a conventional integrated circuit (IC) 700 incorporating semiconductor devices 710 constructed according to the principles of the present invention. The IC 700 may include devices, such as transistors used to form CMOS devices, BiCMOS devices, Bipolar devices, or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes semiconductor devices 710 having dielectric layers 720 located thereover. Additionally, interconnect structures 730 are located within the dielectric layers 720 to interconnect various devices, thus, forming the operational integrated circuit 700.

Although the present invention has been described in detail, those skilled in the art should understand that they can make various changes, substitutions and alterations herein without departing from the spirit and scope of the invention in its broadest form.

What is claimed is:

1. A method for implanting a dopant in a substrate, comprising:

tilting a substrate located on or over an implant platen about an axis in a first direction with respect to an implant source, wherein the substrate has one or more patterned gate structures located thereover;

implanting a portion of an implant dose within the substrate and below the one or more patterned gate structures, the substrate tilted in the first direction;

tilting the substrate having already been tilted in the first direction about the axis in a second opposite direction;

implanting at least a portion of the implant dose within the substrate and below the one or more patterned gate structures, the substrate tilted in the second opposite direction;

rotating the substrate by about 90 degrees from its original position after implanting at least a portion of the implant dose within the substrate tilted in the second opposite direction;

tilting the rotated substrate about the axis a second time in the first direction;

implanting a portion of the implant dose within the substrate and below the one or more patterned gate structures, the substrate tilted in the first direction the second time;

tilting the substrate having already been tilted a second time in the first direction about the axis a second time in the second opposite direction; and implanting a remaining portion of the implant dose within the substrate and below the one or more patterned gate structures, the substrate tilted in the second opposite direction the second time.

2. The method as recited in claim 1 wherein implanting a portion of an implant dose within the substrate tilted in the first direction includes implanting about ¼ of the implant dose, implanting at least a portion of the implant dose within the substrate tilted in the second opposite direction includes implanting about ¼ of the implant dose, implanting a portion of the implant dose within the substrate tilted in the first direction the second time includes implanting about ¼ of the implant dose, and implanting a remaining portion of the implant dose within the substrate tilted in the second opposite direction the second time includes implanting about ¼ of the implant dose.

3. The method as recited in claim 1 wherein rotating the substrate by about 90 degrees from its original position includes rotating the substrate by about 90 degrees in a clockwise direction from its original position.

4. The method as recited in claim 1 wherein tilting a substrate located on or over an implant platen about an axis in a first direction includes tilting a substrate located on or over an implant platen about an axis up to about 5 degrees in a first direction and tilting the substrate having already been tilted in the first direction about the axis in a second opposite direction includes tilting the substrate having already been tilted in the first direction about the axis up to about 5 degrees in a second opposite direction.

5. The method as recited in claim 1 wherein tilting a substrate located on or over an implant platen about an axis in a first direction includes tilting a substrate located on or over an implant platen about an axis from about 1 to about 3 degrees in a first direction and tilting the substrate having already been tilted in the first direction about the axis in a second opposite direction includes tilting the substrate having already been tilted in the first direction about the axis from about 1 to about 3 degrees in a second opposite direction.

6. The method as recited in claim 1 wherein an angle of tilt in the first direction is substantially identical to an implant angle error in the implant source.

7. The method as recited in claim 1 wherein an angle of tilt in the first direction is substantially identical to an angle of tilt in the second opposite direction.

8. The method as recited in claim 1 wherein the substrate is fixed in the platen and the platen tilts about the axis in the first and second opposite direction.

9. A method for manufacturing a semiconductor device, comprising:

forming a gate structure over a substrate; and forming implants within the substrate below the gate structure, including;

tilting the substrate located on or over an implant platen about an axis in a first direction with respect to an implant source;

implanting a portion of an implant dose within the substrate tilted in the first direction;

tilting the substrate having already been tilted in the first direction about the axis in a second opposite direction;

implanting at least a portion of the implant dose within the substrate tilted in the second opposite direction;

rotating the substrate by about 90 degrees from its original position after implanting at least a portion of the implant dose within the substrate tilted in the second opposite direction;

tilting the rotated substrate about the axis a second time in the first direction;

implanting a portion of the implant dose within the substrate tilted in the first direction the second time;

tilting the substrate having already been tilted a second time in the first direction about the axis a second time in the second opposite direction; and implanting a remaining portion of the implant dose within the substrate tilted in the second opposite direction the second time.

10. The method as recited in claim 9 wherein implanting a portion of an implant dose within the substrate tilted in the first direction includes implanting about ¼ of the implant dose, implanting at least a portion of the implant dose within the substrate tilted in the second opposite direction includes implanting about ¼ of the implant dose, implanting a portion of the implant dose within the substrate tilted in the first direction the second time includes implanting about ¼ of the implant dose, and implanting a remaining portion of the implant dose within the substrate tilted in the second opposite direction the second time includes implanting about ¼ of the implant dose.

11. The method as recited in claim 9 wherein rotating the substrate by about 90 degrees from its original position includes rotating the substrate by about 90 degrees in a clockwise direction from its original position.

12. The method as recited in claim 9 wherein tilting a substrate located on or over an implant platen about an axis in a first direction includes tilting a substrate located on or over an implant platen about an axis up to about 5 degrees in a first direction and tilting the substrate having already been tilted in the first direction about the axis in a second opposite direction includes tilting the substrate having already been tilted in the first direction about the axis up to about 5 degrees in a second opposite direction.

13. The method as recited in claim 9 wherein wherein an angle of tilt in the first direction is substantially identical to an implant angle error in the implant source.

14. The method as recited in claim 9 wherein an angle of tilt in the first direction is substantially identical to an angle of tilt in the second opposite direction.

15. The method as recited in claim 9 wherein the substrate tilts about the axis in the platen in the first and second opposite direction.

16. The method as recited in claim 9 wherein implanting includes implanting at least a portion of source/drain extension implants.

17. The method as recited in claim 1 wherein implanting a portion of an implant dose includes implanting a dopant to form a portion of source/drain implants.

18. The method as recited in claim 9 wherein implanting a portion of an implant dose includes implanting a dopant to form a portion of source/drain implants.

19. A method for implanting a dopant in a substrate, comprising:

tilting a substrate located on or over an implant platen about an axis in a first direction with respect to an implant source, wherein the substrate has one or more patterned gate structures located thereover;

implanting a portion of an implant dose within the substrate and below the one or more patterned gate structures, the substrate tilted in the first direction;

tilting the substrate having been tilted in the first direction about the axis in a second opposite direction with respect to the implant source;

implanting at least a portion of the implant dose within the substrate and below the one or more patterned gate structures, the substrate tilted in the second opposite direction;

rotating the substrate by about 90 degrees after implanting at least a portion of the implant dose within the substrate tilted in the first direction;

tilting the rotated substrate about the axis in the first direction;

implanting a portion of the implant dose within the rotated substrate and below the one or more patterned gate structures, the rotated substrate tilted in the first direction;

tilting the rotated substrate in the second opposite direction; and implanting a portion of the implant dose within the rotated substrate and below the one or more patterned gate structures, the rotated substrate tilted in the second opposite direction.

20. The method as recited in claim 19 wherein tilting the substrate in a first direction and tilting the substrate having been tilted in the first direction in a second opposite direction occur before rotating the substrate.

* * * * *